United States Patent

Carbajal, III et al.

[15] 3,673,679

[45] July 4, 1972

[54] COMPLEMENTARY INSULATED GATE FIELD EFFECT DEVICES

[72] Inventors: Bernard G. Carbajal, III; William Milton Gosney, both of Richardson; Lou H. Hall, Dallas, all of Tex.

[73] Assignee: Texas Instruments Incorporated, Dallas, Tex.

[22] Filed: Dec. 1, 1970

[21] Appl. No.: 94,138

[52] U.S. Cl. ....................29/571, 29/578, 148/188
[51] Int. Cl. ....................B01j 17/00, H01g 13/00
[58] Field of Search ....................29/571, 578

[56] References Cited

UNITED STATES PATENTS

| | | | |
|---|---|---|---|
| 3,445,924 | 5/1969 | Cheroff et al. | 29/578 X |
| 3,566,518 | 3/1971 | Brown et al | 29/571 |
| 3,608,189 | 9/1971 | Gray | 29/571 |

*Primary Examiner*—John F. Campbell
*Assistant Examiner*—W. Tupman
*Attorney*—James O. Dixon, Andrew M. Hassell, Harold Levin, Melvin Sharp, Michael A. Sileo, Jr., Henry T. Olsen, John E. Vandigriff and Gary C. Honeycutt

[57] ABSTRACT

A complementary pair of insulated gate field effect transistors is fabricated in a monocrystalline silicon wafer. The method features the use of doped-oxide diffusion sources, self-aligned, passivated-gate electrodes, and the concurrent diffusion of the source and the drain regions for both the n-channel device and the p-channel device in a single step.

11 Claims, 8 Drawing Figures

INVENTORS
BERNARD G. CARBAJAL, III
WILLIAM MILTON GOSNEY
LOU H. HALL
BY Gary C. Honeycutt
ATTORNEY

COMPLEMENTARY INSULATED GATE FIELD EFFECT DEVICES

This invention relates generally to the fabrication of semiconductor devices and, more particularly, to the fabrication of complementary MOS transistors having self-aligned, passivated-gate electrodes. A concurrent diffusion of the source and drain regions for both the n-channel and the p-channel devices is achieved in a single step using doped-oxide diffusion sources.

Recent developments in the fabrication of insulated gate field effect devices have emphasized the need to avoid overlap between the gate electrodes and the source or drain regions, in order to reduce Miller-type capacitance and thereby increase the frequency range of the device. Various self-aligned gate technologies have been reported including, for example, the use of a patterned gate electrode as a diffusion mask. While this approach has successfully reduced Miller-type capacitance in single MOS devices, it has not been applied to complementary MOS devices. Still further, metallization failures due to sharp oxide contours have not been overcome by such prior technology.

Complementary MOS transistors have been known for several years, but in practice they are difficult to fabricate. Both the n-channel and the p-channel devices must function in the enhancement mode. Generally, this presents no difficulty with the p-channel devices; however, the n-channel devices naturally tend to function as depletion mode devices because of the positive surface-state charge in the gate oxide region.

It is an object of the present invention to provide an improved method for the fabrication of complementary insulated gate field effect devices. More particularly, it is an object of the invention to provide an improved self-aligned gate technique for the fabrication of complementary devices, while maintaining adequate control over doping levels obtained in the formation of source and drain regions.

It is also an object of the invention to provide improved gate insulation and passivation in the fabrication of such devices, while minimizing the abruptness of oxide contours and thereby improving metallization yields. A further object is to provide a self-aligned complementary MOS process which assures enhancement mode operation of the n-channel device, and independent control over the threshold voltage of the n-channel device.

The invention is embodied in a method for the fabrication of a complementary pair of insulated gate field effect devices, beginning with the step of forming a first insulative film on the surface of a monocrystalline semiconductor body of one conductivity type, followed by the patterning of the film to expose a first area of the semiconductor surface for the fabrication of a device having source and drain regions of the same conductivity type as the semiconductor body. The exposed semiconductor surface is then covered with a doped insulative film which serves as a diffusion source for the formation of a first region therein of opposite conductivity type.

After heating the composite structure to diffusion temperature for a time sufficient to cause the desired impurity diffusion from the doped film into the semiconductor, the doped insulative film is then removed along with a sufficient portion of the thickness of the first insulative film to insure removal of all remaining excess dopant. If desired, the entire first insulative film may be removed. The wafer is then heated to diffusion temperature for a sufficient time to cause a deeper diffusion of the impurity into the semiconductor. Preferably, this step is carried out in an oxidizing atmosphere, when the semiconductor is silicon, in order to provide a new, third insulative film on the wafer surface. The thickened surface film is again patterned to re-expose a portion of the diffused region and to expose a second area of the semiconductor body for the fabrication of a device which is complementary to the device to be completed in the initially diffused region.

A fourth insulative film is then formed on the exposed areas of the semiconductor surface to serve as the gate insulation, followed by the deposition of a conductor film which is then patterned, along with the gate insulation, to provide an insulated gate electrode for each of the devices, and to expose areas which will receive further diffusions.

A fifth insulative film, containing a suitable dopant, is then deposited on the wafer to serve as a diffusion source in forming the source and drain for one of the devices, followed by a selective removal thereof from the area of the other device. A sixth insulative film, containing a suitable dopant of the opposite type, is then deposited to cover the newly re-exposed portions of the first-exposed semiconductor area, followed by a second diffusion step in which the wafer is heated to a diffusion temperature sufficiently high, and for a time sufficiently long, to cause diffusion of the impurities from both the fifth and the sixth insulative films, respectively, thereby forming source and drain regions for both devices concurrently in a single step.

And, finally, the remaining insulative films are selectively exposed to a suitable etchant for opening contact windows, followed by metallization to provide ohmic contacts to each gate electrode, to each source region and to each drain region, respectively, thereby completing complementary n-channel and p-channel devices.

In a preferred embodiment, the first insulative film is a thermally-grown silicon oxide film formed on a surface of a monocrystalline silicon body of n-type conductivity. The oxide layer is then patterned by selective etching to expose an area of the silicon surface wherein the source, drain and gate regions of the n-channel device are to be located. The second insulative film is a boron-doped layer of silicon oxide deposited by the oxidation of a reactant stream containing silane and diborane. Preferably, the boron-doped layer is then covered with an undoped silicon dioxide layer to prevent out-diffusion. The wafer is then heated to diffusion temperature for a short time to predeposit a shallow boron-doped region of p-type conductivity in the silicon surface.

The deposited oxide layers are then removed, including a substantial portion of the thickness of the initial, thermally-grown layer to insure removal of all excess boron. The wafer is again heated to diffusion temperature to drive in the boron and concurrently to form a new thermal oxide layer or to thicken any remaining oxide. The thickened oxide layer is then patterned to re-expose a portion of the p-type region and to expose a separate area of the silicon surface at a location where the complementary p-channel device is to be formed. The wafer is again subjected to thermal oxidation for a short time, sufficient to form the oxide portion of the gate insulation, followed by a deposition of silicon nitride thereon to complete the oxide-nitride composite gate insulation layer. A molybdenum film is then deposited on the nitride film to provide metal for the gate electrodes of each device, respectively. Additional portions of the molybdenum film are preferably patterned on the thick oxide surface to provide a buried layer of electrical interconnections at the time of patterning the gate electrodes.

After selective etching of the metal and the nitride films, sufficient oxide is removed to re-expose the silicon at the locations where source and drain regions are to be formed. The fifth insulative layer, preferably boron-doped silicon oxide, is then deposited on the wafer and patterned to serve as the diffusion source for the formation of source and drain regions for the p-channel device. The sixth insulative layer, preferably phosphorus-doped silicon oxide, is then deposited on the wafer to serve as the diffusion source for forming source and drain regions of the n-channel device. The entire wafer is then preferably covered with a layer of undoped silicon oxide, as before, to prevent out-diffusion. The wafer is then heated to diffusion temperature for concurrent formation of the source and drain regions of both devices in a single step. Access windows through the oxide layers and ohmic contact metallization are then provided to complete the structure.

Figure 1:
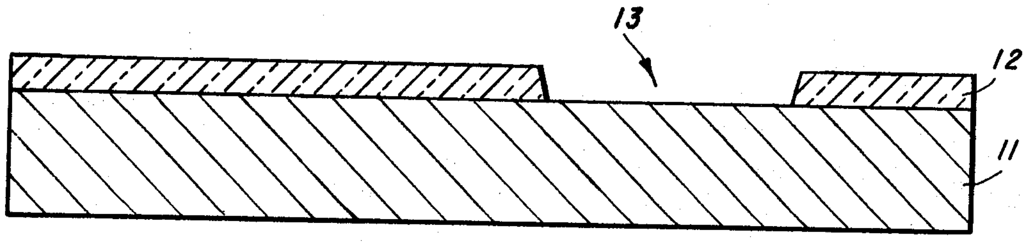
FIGS. 1–7 are enlarged, cross-sectional views of a semiconductor wafer, illustrating various intermediate stages of a preferred embodiment of the process of the invention.

As shown in FIG. 1, monocrystalline silicon wafer 11 of n-type conductivity, having a resistivity of 4 – 6 ohm-centimeters is subjected to steam oxidation at a temperature of 1,050° – 1,250° C. for 15 minutes to 1 hour, preferably at 1,100° for 30 minutes, thereby forming an oxide layer 12 of 3,000 – 8,000 angstroms, preferably about 4,800 angstroms thick. Using known photolithographic techniques, window 13 is then opened by selective etching.

Figure 2:
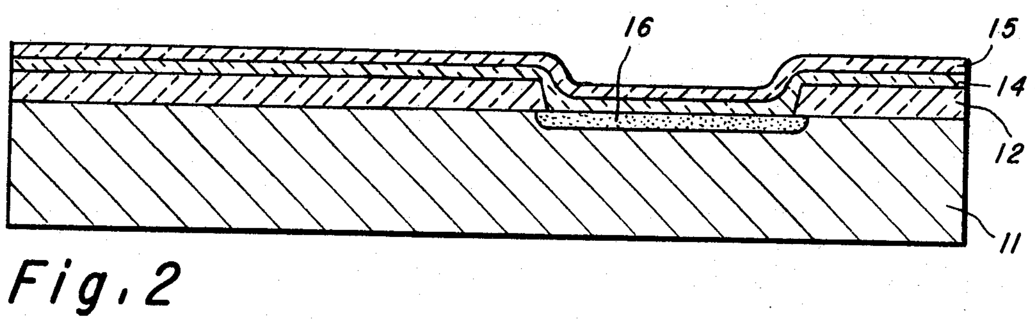

As shown in FIG. 2, the structure of FIG. 1 is then coated with a boron-doped silicon oxide layer 14, having a thickness of about 500 angstroms to 2,500 angstroms, preferably about 1,000 angstroms. Although various techniques are known for the deposition of a doped oxide diffusion source, it is preferred to react silane and diborane with oxygen at a temperature of about 300° – 450° C.. Layer 14 is then covered with an undoped silane oxide layer 15 provided, for example, by continuing the deposition of silane oxide after discontinuing the flow of diborane. The structure is then heated to diffusion temperature for a time sufficient to form a shallow region 16 of p-type conductivity having a sheet resistance in the range of about 900 – 1,400 ohms per square, for example. Suitable conditions for the formation of region 16 include heating in a nitrogen atmosphere at about 1,100° C. for 15 minutes.

Figure 3:
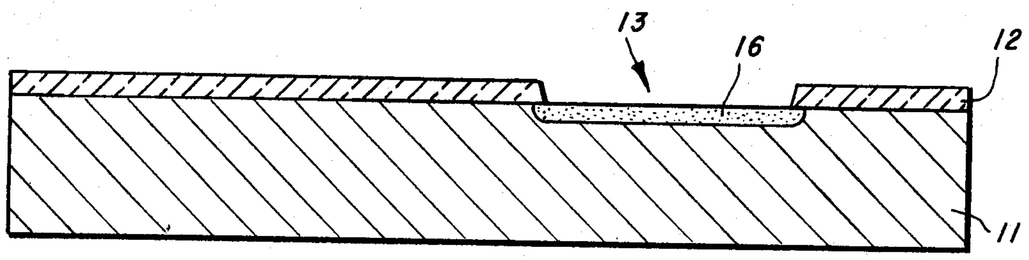

As shown in FIG. 3, the structure of FIG. 2 is then treated with aqueous HF for the complete removal of oxide layers 14 and 15. The oxide removal step is continued until at least a substantial portion of layer 12 is also removed, for the purpose of insuring the complete removal of boron which diffuses into layer 12 concurrently with the formation of region 16.

As shown in FIG. 4, the wafer is again heated to diffusion temperature to drive in the boron dopant, thereby enlarging diffused region 16. The drive-in is preferably conducted in an oxidizing atmosphere in order to reestablish and thicken oxide layer 12. Optionally, the thermal oxide may be replaced by an undoped, deposited insulative film. Suitable conditions for the drive-in operation include a temperature of 1,150° – 1,300° C. for 1 – 5 hours, preferably about 1,250° C. for 3 hours, including dry oxygen or steam to provide an oxide thickness of about 1 micron, for example.

Figure 4:
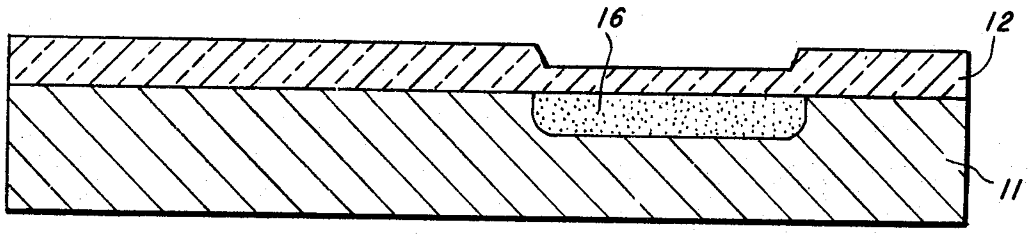
Figure 5:
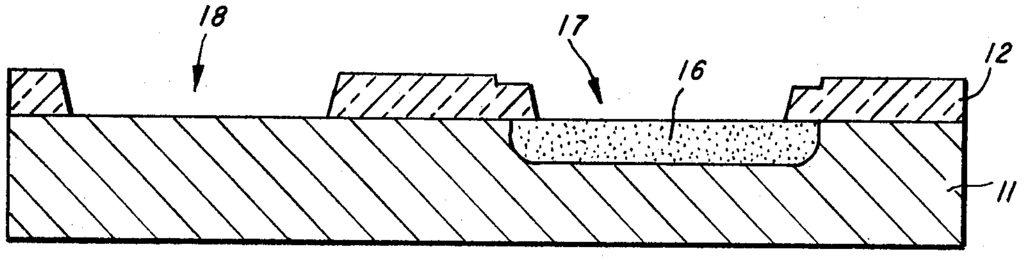

As shown in FIG. 5, oxide layer 12 of FIG. 4 is then patterned by known photolithographic techniques to open windows 17 and 18, thereby exposing a portion of region 16 wherein the source, gate and drain of the n-channel device is to be provided and window 18 wherein the source, gate and drain of the p-channel device are to be located.

Figure 6:
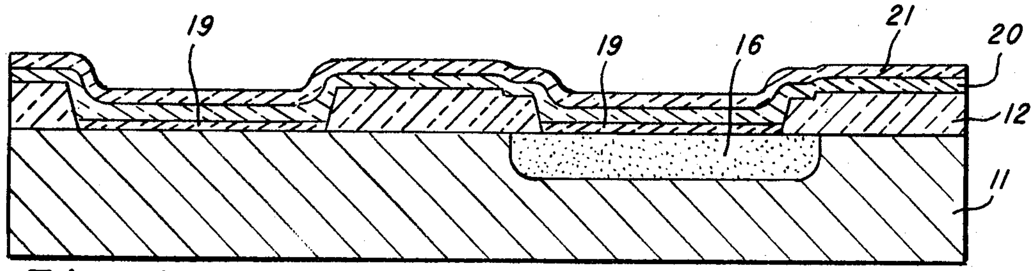

As shown in FIG. 6, the wafer of FIG. 5 is returned to an oxidation furnace wherein it is subjected to a temperature of about 1,100° C. in dry oxygen, for example, for a time of about 20 – 30 minutes, sufficient to yield thermal oxide layer 19 having a thickness of 500 – 1,200 angstroms, preferably about 750 – 800 angstroms. Silicon nitride film 20 is then deposited over oxide 12 by chemical vapor deposition. For example, silane is reacted with ammonia at a temperature of about 900° C.. A conductive material 21, from which the gate electrodes are to be patterned, is then deposited on nitride layer 20. An electron-beam-evaporated film of molybdenum has been found suitable, having a thickness of about 3,000 angstroms, for example. In an alternate embodiment, polycrystalline silicon is deposited as the gage electrode material. Any conductive material is useful for this purpose, provided it can withstand the high temperature diffusion step which follows and provided it can be patterned by selective etching techniques. Other useful metals include tungsten, tantalum, and the metals of the platinum-palladium group.

Figure 7:
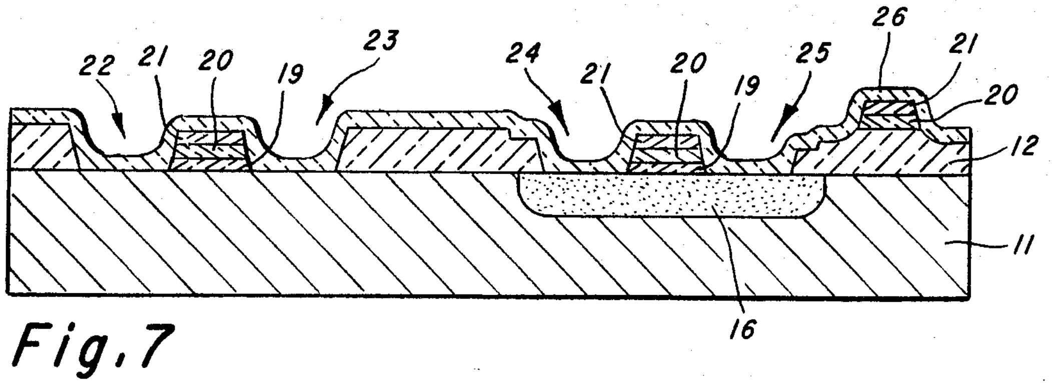

As shown in FIG. 7, the gate metal is then patterned, using known photolithographic techniques to remove all the metal except that portion which is to serve as the gate electrode for the n-channel device and the gate electrode for the p-channel device. Optionally, a third portion of the metal film may be retained, on oxide layer 12, to provide a buried layer of metal interconnections at the time of patterning the gate electrodes.

Then, using the patterned metal layer 21 as an etch resistant mask, nitride layer 20 and oxide layer 19 are removed while retaining most of thick oxide 12, thereby re-exposing the silicon surface at locations where the source and drain regions are to be formed. A particularly desirable etching method to remove the nitride and oxide layers includes the use of a dilute aqueous hydrofluoric acid solution at elevated temperature, preferably 0.5% HF at a temperature of 80° – 90° C.. It has been shown that such an etchant solution attacks silicon nitride and silicon oxide at substantially the same etch rate, thereby avoiding any substantial undercutting or shelving. In an alternate embodiment, nitride layer 20 is removed with phosphoric acid, followed by the removal of oxide layer 19, using a conventional HF etch. The structure is then coated with layer 26 of boron-doped silicon oxide, deposited preferably in accordance with the procedure used in the deposit of layer 14.

Figure 8:
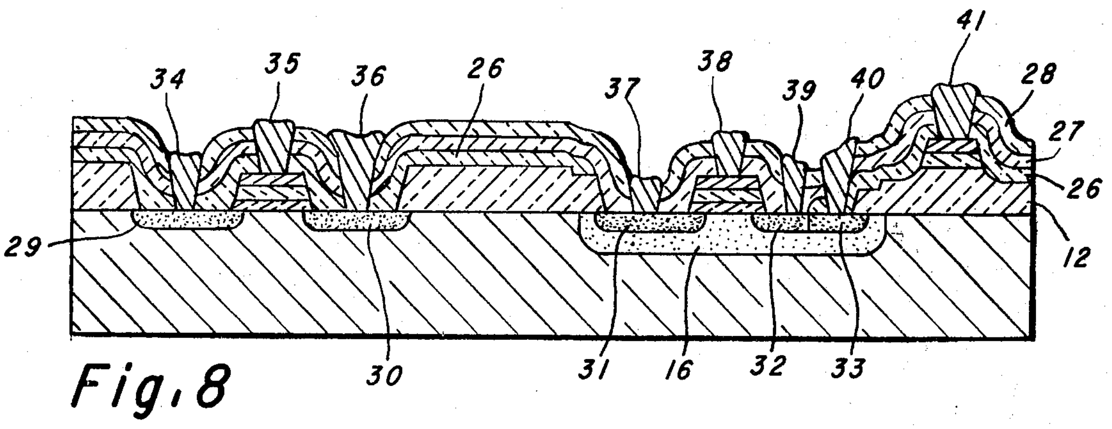
FIG. 8 is an enlarged, cross-sectional view of the completed structure showing a complementary pair of MOS devices completed in accordance with the process illustrated by FIGS. 1–7.

As shown in FIG. 8 layer 26 is then patterned by selective etching to re-expose window 24 and a portion of window 25 wherein the n-channel source and drain regions are to be diffused. Then, a phosphorus-doped silicon oxide layer 27 is deposited by chemical vapor deposition, including, for example, the reaction of silane plus phosphine with oxygen at a substrate temperature of about 300° – 450° C.. Preferably, the wafer is then covered with an undoped silane oxide layer 28 having a thickness, for example, substantially equal to that of layer 26 or 27. The structure is then heated to diffusion temperature for a time sufficient to form the source and drain regions 29, 30, 31, and 32. For example, the wafer is heated for about 1 hour in nitrogen at 1,100° C.. Region 33 is concurrently provided, within region 16 to provide ohmic contact for electrical grounding. Access windows for ohmic contacts are then provided, followed by the deposition of aluminum, for example, which is then patterned for the formation of ohmic contacts 34, 35, 36, 37, 38, 39, 40, and 41 to complete the structure of the preferred embodiment of the invention.

Thus, it will be apparent that the use of the foregoing method is particularly advantageous in that it not only provides for improved diffusion control in the formation of source and drain regions, but also provides a buried level of electrical interconnections, and complete passivation for the gate electrodes and gate dielectric layers. Moreover, the combination of doped and undoped layers 26, 27, and 28 inherently provides sloped edges upon selective etching to open contact windows. The sloped edges are advantageous in that they reduce the sharpness of oxide contours and thereby increase yields in the subsequent metallization step. It will also be apparent that the invention may be employed to fabricate complementary devices in a wafer having p-type conductivity, for example, by reversing the conductivity types in each of regions 16, 29, 30, 31, 32, and 33.

Although silica is the preferred insulative film, alumina, silica-alumina and other insulative materials are suitable for use as any of layers 12, 14, 15, 19, 20, 26, 27, and 28 in the process of the invention.

What is claimed is:

1. A method for the fabrication of complementary MOS transistors comprising:

forming a first insulative film on the surface of a monocrystalline semiconductor body of one conductivity type;

selectively removing a portion of said film to expose a first area of said surface for the formation of a first device;

forming a second insulative film on said first area, said second film containing a suitable impurity for converting said first area and the underlying semiconductor region to the opposite conductivity type;

heating the composite structure to a temperature sufficiently high to cause of said impurity from the second film into the underlying semiconductor region, thereby converting said region to the opposite conductivity type;

selectively removing the second film and at least a portion of the first film;

heating said body to a diffusion temperature sufficiently high to drive the dopant deeper into said body;

forming a third insulative film covering said body;

selectively removing first and second portions of said third film to re-expose portions of said first area and to expose a second area of said body for the formation therein of a second device;

forming a fourth insulative film covering said re-exposed area and said second area;

forming a conductor film covering said fourth insulating film;

selectively removing a portion of said conductor film and portions of the underlying fourth insulative film to leave first and second insulated gate electrodes covering a portion of each of said first and second areas, respectively;

forming a fifth insulative film covering the composite structure, including particularly the portions of said first and second areas not covered by said gate electrodes, said fifth insulative film containing a suitable impurity for converting the underlying portions of said body to the opposite conductivity type;

selectively removing a portion of said fifth insulative film to again re-expose portions of said first area on opposite sides of said first gate electrode;

forming a sixth insulative film covering the newly re-exposed portions of said first area, said sixth insulative film containing a suitable impurity for reconverting a portion of said body to its initial conductivity type;

heating said body to a diffusion temperature sufficiently high to cause diffusion of said impurities from the fifth and sixth insulative films, respectively, into said body, thereby forming source and drain regions on opposite sides of each of said gate electrodes, respectively; and forming ohmic contacts to each gate electrode and each of said source and drain regions, respectively, thereby completing complementary n-channel and p-channel devices.

2. A method as defined by claim 1 wherein said semiconductor body is n-type silicon.

3. A method as defined by claim 2 wherein said first insulative film is thermally-grown silicon oxide.

4. A method as defined by claim 3 wherein said second insulative film is boron-doped silicon oxide.

5. A method as defined by claim 4 wherein a layer of undoped oxide is deposited on said boron-doped oxide prior to the first heating step.

6. A method as defined by claim 1 wherein said fourth insulative film comprises a first layer of thermally-grown silicon oxide and a deposited second layer of silicon nitride.

7. A method as defined by claim 6 wherein said conductor film is molybdenum.

8. A method as defined by claim 1 wherein said fifth insulative film is boron-doped silicon oxide.

9. A method as defined by claim 8 wherein said sixth insulative film is phosphorous-doped silicon oxide.

10. A method as defined by claim 9 wherein a layer of undoped silicon oxide is deposited on said sixth insulative film prior to the second heating step.

11. A method as defined by claim 1 wherein a portion of said conductor film is retained on said fourth insulating film as a buried level of electrical interconnections.

* * * * *